US009076646B2

(12) United States Patent
Sims et al.

(10) Patent No.: US 9,076,646 B2
(45) Date of Patent: *Jul. 7, 2015

(54) PLASMA ENHANCED ATOMIC LAYER DEPOSITION WITH PULSED PLASMA EXPOSURE

(71) Applicant: Lam Research Corporation, Fremont, CA (US)

(72) Inventors: James S. Sims, Tigard, OR (US); Jon Henri, West Linn, OR (US); Kathryn M. Kelchner, Portland, OR (US); Sathish Babu S. V. Janjam, Albany, NY (US); Shane Tang, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/144,107

(22) Filed: Dec. 30, 2013

(65) Prior Publication Data
US 2014/0113457 A1   Apr. 24, 2014

Related U.S. Application Data

(63) Continuation-in-part of application No. 13/084,399, filed on Apr. 11, 2011.

(60) Provisional application No. 61/324,710, filed on Apr. 15, 2010, provisional application No. 61/372,367, filed on Aug. 10, 2010, provisional application No. 61/379,081, filed on Sep. 1, 2010, provisional application No. 61/417,807, filed on Nov. 29, 2010.

(51) Int. Cl.
H01L 21/02       (2006.01)
C23C 16/515     (2006.01)
(Continued)

(52) U.S. Cl.
CPC .......... *H01L 21/0217* (2013.01); *C23C 16/515* (2013.01); *C23C 16/045* (2013.01);
(Continued)

(58) Field of Classification Search
USPC .......................................... 438/680, 696, 792
See application file for complete search history.

(56) References Cited

U.S. PATENT DOCUMENTS 4,500,563 A    2/1985   Ellenberger et al.
5,496,608 A    3/1996   Matsuda et al.
(Continued)

FOREIGN PATENT DOCUMENTS

EP    2 278 046    1/2011
JP    4364320      8/2009
(Continued)

OTHER PUBLICATIONS

U.S. Appl. No. 14/074,617, filed Nov. 7, 2013, entitled "Methods For Depositing Films on Sensitive Substrates" [LAMRP019].
(Continued)

*Primary Examiner* — Alexander Ghyka
(74) *Attorney, Agent, or Firm* — Weaver Austin Villeneuve & Sampson LLP

(57) ABSTRACT

The embodiments herein focus on plasma enhanced atomic layer deposition (PEALD) processes using pulsed plasmas. While conventional PEALD processes use continuous wave plasmas during the plasma exposure/conversion operation, the embodiments herein utilize a pulsed plasma during this operation to achieve a film with high quality sidewalls. Because conventional PEALD techniques result in films having high quality at the bottom and top of a feature, but low quality on the sidewalls, this increased sidewall quality in the disclosed methods corresponds to a film that is overall more uniform in quality compared to that achieved with conventional continuous wave plasma techniques.

19 Claims, 8 Drawing Sheets

(51) Int. Cl.

| | |
|---|---|
| *C23C 16/04* | (2006.01) |
| *C23C 16/34* | (2006.01) |
| *C23C 16/40* | (2006.01) |
| *C23C 16/455* | (2006.01) |
| *C23C 16/56* | (2006.01) |
| *H01L 21/67* | (2006.01) |
| *H01L 21/762* | (2006.01) |
| *H01L 21/768* | (2006.01) |
| *H01L 21/311* | (2006.01) |

(52) U.S. Cl.
CPC .............. *C23C16/345* (2013.01); *C23C 16/402* (2013.01); *C23C 16/45523* (2013.01); *C23C 16/4554* (2013.01); *C23C 16/56* (2013.01); *H01L 21/02164* (2013.01); *H01L 21/02274* (2013.01); *H01L 21/0228* (2013.01); *H01L 21/67017* (2013.01); *H01L 21/6719* (2013.01); *H01L 21/67201* (2013.01); *H01L 21/76224* (2013.01); *H01L 21/76829* (2013.01); *H01L 21/02167* (2013.01); *H01L 21/02175* (2013.01); *H01L 21/31111* (2013.01)

(56) References Cited

U.S. PATENT DOCUMENTS

| | | |
|---|---|---|
| 5,670,432 A | 9/1997 | Tsai |
| 5,856,003 A | 1/1999 | Chiu |
| 5,874,368 A | 2/1999 | Laxman et al. |
| 5,932,286 A | 8/1999 | Beinglass et al. |
| 6,270,572 B1 | 8/2001 | Kim et al. |
| 6,391,803 B1 | 5/2002 | Kim et al. |
| 6,428,859 B1 | 8/2002 | Chiang et al. |
| 6,468,924 B2 | 10/2002 | Lee et al. |
| 6,528,430 B2 | 3/2003 | Kwan et al. |
| 6,551,893 B1 | 4/2003 | Zheng et al. |
| 6,576,053 B1 | 6/2003 | Kim et al. |
| 6,632,478 B2 | 10/2003 | Gaillard et al. |
| 6,645,574 B1 | 11/2003 | Lee et al. |
| 6,723,595 B2 | 4/2004 | Park |
| 6,730,614 B1 | 5/2004 | Lim et al. |
| 6,743,738 B2 | 6/2004 | Todd |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,132,353 B1 | 11/2006 | Xia et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,390,743 B2 | 6/2008 | Shin |
| 7,393,561 B2 | 7/2008 | Paranjpe |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,601,648 B2 | 10/2009 | Chua et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,713,592 B2 | 5/2010 | Nguyen et al. |
| 7,758,920 B2 | 7/2010 | Hasebe et al. |
| 7,776,733 B2 | 8/2010 | Hasegawa |
| 7,825,039 B2 | 11/2010 | Takahashi et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,637,411 B2 | 1/2014 | Swaminathan et al. |
| 8,647,993 B2 | 2/2014 | Lavoie et al. |
| 8,728,956 B2 | 5/2014 | LaVoie et al. |
| 2002/0076507 A1 | 6/2002 | Chiang et al. |
| 2004/0033698 A1 | 2/2004 | Lee et al. |
| 2004/0053515 A1 | 3/2004 | Comita et al. |
| 2004/0231799 A1 | 11/2004 | Lee et al. |
| 2005/0042865 A1 | 2/2005 | Cabral et al. |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0181535 A1 | 8/2005 | Yun et al. |
| 2005/0196977 A1 | 9/2005 | Saito et al. |
| 2005/0233553 A1 | 10/2005 | Kountz et al. |
| 2005/0260347 A1 | 11/2005 | Narwankar et al. |
| 2005/0287775 A1 | 12/2005 | Hasebe et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |

(56) References Cited

U.S. PATENT DOCUMENTS

| | | |
|---|---|---|
| 2006/0199357 A1 | 9/2006 | Wan et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0137572 A1 | 6/2007 | Matsuura et al. |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0232082 A1 | 10/2007 | Balseanu et al. |
| 2007/0251444 A1 | 11/2007 | Gros et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0131601 A1 | 6/2008 | Kim et al. |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1* | 3/2009 | Dussarrat ............. 438/787 |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0096688 A1* | 4/2010 | Balseanu et al. ............. 257/324 |
| 2010/0102417 A1 | 4/2010 | Ganguli et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0221925 A1 | 9/2010 | Lee et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0086516 A1 | 4/2011 | Lee et al. |
| 2011/0151142 A1 | 6/2011 | Seamons et al. |
| 2011/0159202 A1 | 6/2011 | Matsushita et al. |
| 2011/0198756 A1* | 8/2011 | Thenappan et al. ........... 257/751 |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2012/0009802 A1 | 1/2012 | LaVoie et al. |
| 2012/0009803 A1 | 1/2012 | Jung et al. |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0108079 A1 | 5/2012 | Mahajani |
| 2012/0164846 A1 | 6/2012 | Ha et al. |
| 2012/0213940 A1 | 8/2012 | Mallick |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0309415 A1 | 11/2013 | Swaminathan et al. |
| 2013/0319329 A1 | 12/2013 | Li et al. |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0209562 A1 | 7/2014 | LaVoie et al. |
| 2014/0216337 A1 | 8/2014 | Swaminathan et al. |

FOREIGN PATENT DOCUMENTS

| | | |
|---|---|---|
| JP | 2010-10497 | 1/2010 |
| KR | 10-2001-0111448 | 12/2001 |
| KR | 10-2004-0001036 | 1/2004 |
| KR | 10-2009-0057665 | 6/2009 |
| KR | 10-2009-0080019 | 7/2009 |
| KR | 10-2009-0081396 | 7/2009 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/087737 | 6/2012 |
| WO | WO 2013/032786 | 3/2013 |
| WO | WO 2013/043330 | 3/2013 |
| WO | WO 2013/112727 | 8/2013 |

OTHER PUBLICATIONS

U.S. Appl. No. 14/137,860, filed Dec. 20, 2013, entitled "Gapfill of Variable Aspect Ratio Features with a Composite Peald and Pecvd Method" [LAMRP066].

U.S. Appl. No. 14/183,287, filed Feb. 18, 2014, entitled "High Growth Rate Process for Conformal Aluminum Nitride." [LAMRP082].

U.S. Appl. No. 14/187,145, filed Feb. 21, 2014, entitled "Plasma Assisted Atomic Layer Deposition Titanium Oxide for Conformal Encapsulation and Gap Fill Applications." [LAMRP083].

U.S. Appl. No. 14/195,653, filed Mar. 3, 2014, entitled "RF Cycle Purging to Reduce Surface Roughness in Metal Oxide and Metal Nitride Films." [LAMRP084].

U.S. Appl. No. 14/194,324, filed Feb. 28, 2014, entitled "Soft Landing Nanolaminates for Advanced Patterning." [LAMRP089].

US Notice of Allowance dated Jan. 15, 2014 issued in U.S. Appl. No. 13/084,399 [NOVLP405].

PCT International Preliminary Report on Patentability and Written Opinion dated Apr. 3, 2014, issued in Application No. PCT/US2012/052769 [NOVLP427WO].

PCT International Preliminary Report on Patentability and Written Opinion dated Mar. 13, 2014, issued in Application No. PCT/US2012/051740 [NOVLP428WO].

Hausmann et al. (2002) "Atomic Layer Deposition of Hafnium and Zirconium Oxides Using Metal Amide Precursors," Chem. Mater. 14(10):4350-4358.

van der Straten et al. (2004) "Atomic layer deposition of tantalum nitride for ultrathin liner applications in advanced copper metallization schemes," Journal of Materials Research, 19(2):447-453.

U.S. Appl. No. 13/963,212, filed Aug. 9, 2013, entitled "Plasma-Activated Deposition of Conformal Films" [NOVLP416X1D1].

U.S. Appl. No. 14/133,239, filed Dec. 18, 2013, entitled "Plasma Activated Conformal Dielectric Film Deposition" [NOVLP427D1].

U.S. Appl. No. 14/065,334, filed Oct. 28, 2013, entitled "Method for Depositing a Cholrine-Free Conformal Sin Film" [NOVLP436C1].

U.S. Appl. No. 13/953,616, filed Jul. 29, 2013, entitled "High Pressure, High Power Plasma Activated Conformal Film Deposition" [LAMRP004].

U.S. Appl. No. 14/074,596, filed Nov. 7, 2013, entitled "Conformal Film Deposition for Gapfill" [LAMRP011].

U.S. Appl. No. 14/061,587, filed Oct. 23, 2013, entitled "Sub-Saturated Atomic Layer Deposition and Conformal Film Deposition" [LAMRP020].

US Office Action dated Mar. 15, 2013 issued in U.S. Appl. No. 13/084,399 [NOVLP405].

US Final Office Action dated Sep. 13, 2013 in U.S. Appl. No. 13/084,399 [NOVLP405].

US Office Action dated Sep. 14, 2012 in U.S. Appl. No. 13/084,305 [NOVLP406].

US Final Office Action dated Apr. 25, 2013 in U.S. Appl. No. 13/084,305 [NOVLP406].

(56) References Cited

OTHER PUBLICATIONS

US Office Action dated Apr. 13, 2011 issued in U.S. Appl. No. 12/889,132 [NOVLP416].
US Notice of Allowance dated Sep. 30, 2011 in U.S. Appl. No. 12/889,132 [NOVLP416].
US Office Action dated Aug. 1, 2012 issued in U.S. Appl. No. 13/011,569 [NOVLP416X1].
US Final Office Action dated Feb. 26, 2013 in U.S. Appl. No. 13/011,569 [NOVLP416X1].
US Notice of Allowance dated May 6, 2013 in U.S. Appl. No. 13/011,569 [NOVLP416X1].
US Office Action dated Apr. 4, 2013 in U.S. Appl. No. 13/242,084 [NOVLP427].
US Notice of Allowance dated Jun. 19, 2013 in U.S. Appl. No. 13/242,084 [NOVLP427].
US Notice of Allowance dated Sep. 19, 2013 in U.S. Appl. No. 13/242,084 [NOVLP427].
US Office Action dated Apr. 29, 2013 in U.S. Appl. No. 13/224,240 [NOVLP428].
US Final Office Action dated Nov. 22, 2013 in U.S. Appl. No. 13/224,240 [NOVLP428].
US Office Action dated Jun. 7, 2013 in U.S. Appl. No. 13/414,619 [NOVLP436].
US Notice of Allowance dated Jul. 26, 2013, in U.S. Appl. No. 13/414,619 [NOVLP436].
US Office Action dated May 24, 2013 in U.S. Appl. No. 13/472,282 [NOVLP441].
US Notice of Allowance dated Oct. 4, 2013 in U.S. Appl. No. 13/472,282 [NOVLP441].
PCT International Search Report and Written Opinion, dated Oct. 20, 2011, issued in PCT/US2011/032186 [NOVLP405WO].
PCT International Preliminary Report on Patentability, dated Oct. 26, 2012, issued in PCT/US2011/032186 [NOVLP405WO].
PCT Invitation to Pay Additional Fees; Communication Re Partial International Search, dated Dec. 16, 2011, issued in PCT/US2011/032303 [NOVLP406WO].
PCT International Search Report and Written Opinion, dated Feb. 20, 2012, issued in PCT/US2011/032303 [NOVLP406WO].
PCT International Preliminary Report on Patentability and Written Opinion, dated Oct. 26, 2012, issued in PCT/US2011/032303 [NOVLP406WO].
PCT International Search Report and Written Opinion dated May 2, 2012 issued in Application No. PCT/US2011/052537 [NOVLP416WO].
PCT International Preliminary Report on Patentability and Written Opinion dated Apr. 4, 2013 issued in Application No. PCT/US2011/052537 [NOVLP416WO].
PCT International Search Report and Written Opinion dated Dec. 18, 2012, issued in Application No. PCT/US2012/052769 [NOVLP427WO].
PCT International Search Report and Written Opinion dated Feb. 28, 2013, issued in Application No. PCT/US2012/051740 [NOVLP428WO].
Korean Notice of Provisional Rejection dated Dec. 9, 2013 issued in KR 10-2012-0043797 [NOVLP436KR].
PCT International Search Report and Written Opinion dated May 27, 2013, issued in Application No. PCT/US2013/022977 [NOVLP441WO].
Cecchi et al., (2007) "Ultra-thin conformal pore-sealing of low-k materials by plasma-assisted ALD," University of New Mexico, Albuquerque, NM, Sandia National Labs, Albuquerque, NM, 1 page.

Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
King, Sean W., (Jul./Aug. 2011) "Plasma enhanced atomic layer deposition of $SiN_x$:H and $SiO_2$," *J. Vac. Sci. Technol.* A29(4):9 pages.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$-Ar-$H_2$ plasma treatment for capacitor electrodes," *Materials Letters*, 59:615-617.
Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Plasma Enhanced Atomic Layer Deposition (PEALD), Website: http://www.asm.com/index.php?option=com_content&task=view&id=19&Itemid=161 (2010), 1 page.
PlasmaPro™, NGP® 80 Range, Next Generation Plasma Systems, *Oxford Instruments* (2010), 8 pages.
U.S. Appl. No. 14/194,549, filed Feb. 28, 2014, entitled "Capped ALD Films for Doping Fin-Shaped Channel Regions of 3-D IC Transistors." [LAMRP081].
U.S. Appl. No. 14/335,785, filed Jul. 18, 2014, entitled "Methods for Depositing Silicon Oxide." [LAMRP125].
US Notice of Allowance dated Aug. 7, 2014 issued U.S. Appl. No. 14/133,239 [NOVLP427D I].
US Examiner's Answer to Appeal Brief (filed May 22, 2014) Before the Patent Trial and Appeal Board dated Aug. 14, 2014 issued U.S. Appl. No. 13/224,240 [NOVLP428].
US Office Action dated Apr. 11, 2014 issued in U.S. Appl. No. 14/065,334 [NOVLP436C1].
US Office Action dated May 21, 2014 issued in U.S. Appl. No. 13/607,386 [NOVLP488].
US Notice of Allowance dated Oct. 8, 2014 issued in U.S. Appl. No. 13/607,386 [NOVLP488].
US Office Action dated Jun. 13, 2014 issued in U.S. Appl. No. 13/953,616 [LAMRP004].
European Extended Search Report dated Apr. 14, 2014 issued in EP 13 15 2046 [NOVLP436EP].
PCT International Preliminary Report on Patentability and Written Opinion dated Aug. 7, 2014, issued in Application No. PCT/US2013/022977 [NOVLP441WO].
Kim, H., et al., (2002) "The Growth of Tantalum Thin Films by Plasma-Enhanced Atomic Layer Deposition and Diffusion Barrier Properties," Mat. Res. Soc. Symp. Proc. 716:B8.5.1-B8.5.6.
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Li, Xingcun, et al., (2011) "Atomic Layer Deposition Al2O3 Thin Films in Magnetized Radio Frequency Plasma Source," *Physics Procedia* 18:100-106.

* cited by examiner

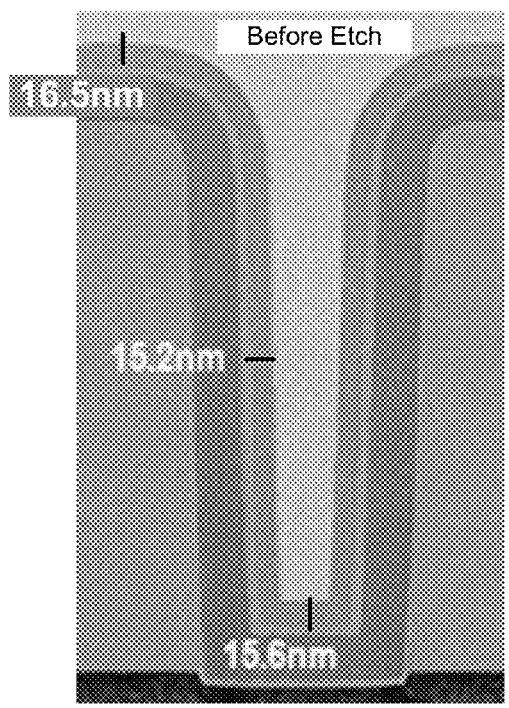
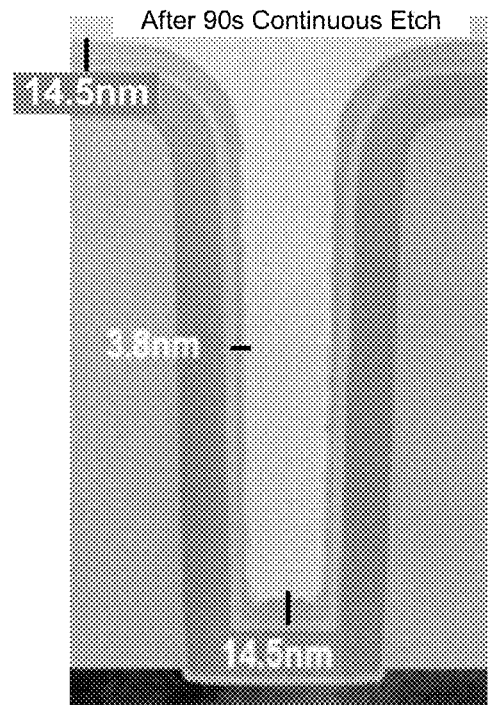
FIG. 5A
FIG. 5B
| Position | 90 second Etch Rate (A/min) |
|---|---|
| Top | 13 |
| Side | 76 |
| Bottom | 7.3 |
FIG. 5C

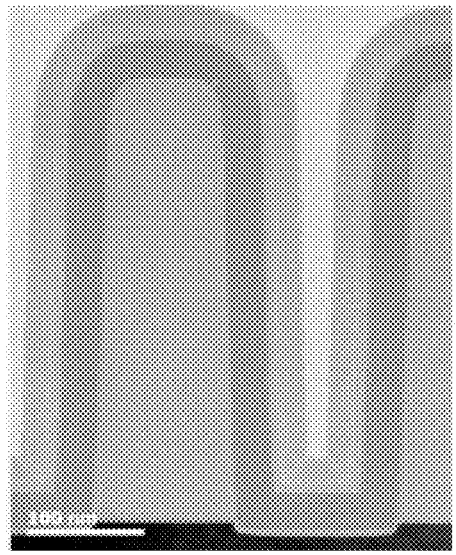
FIG. 6A
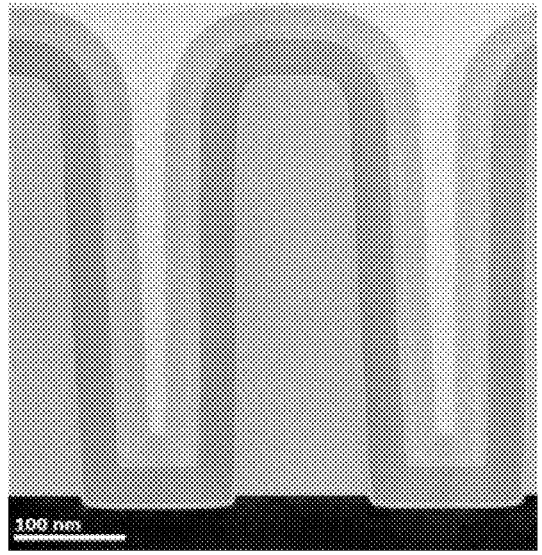
FIG. 6B
| Position | 90 second Etch Rate (A/min) |
|---|---|
| Top | 7 |
| Side | 3.9 |
| Bottom | 7 |
FIG. 6C

PLASMA ENHANCED ATOMIC LAYER DEPOSITION WITH PULSED PLASMA EXPOSURE

CROSS REFERENCE TO RELATED APPLICATIONS

This application is a continuation-in-part of U.S. patent application Ser. No. 13/084,399, filed Apr. 11, 2011, and titled "PLASMA ACTIVATED CONFORMAL FILM DEPOSITION," which is herein incorporated by reference in its entirety for all purposes, and which claims benefit of the following U.S. Provisional Patent Application Nos., each of which is incorporated by reference in its entirety and for all purposes: 61/324,710, filed Apr. 15, 2010; 61/372,367, filed Aug. 10, 2010; 61/379,081, filed Sep. 1, 2010; and 61/417,807, filed Nov. 29, 2010.

BACKGROUND

The fabrication of integrated circuits includes many diverse processing steps. One of the operations frequently employed is the deposition of a dielectric film into a gap between features patterned over or into silicon substrates. One method of depositing such a film is through plasma enhanced atomic layer deposition (PEALD). In this type of method, several operations are undertaken in a cyclic manner to deposit a conformal film. Typically, PEALD processes include the steps of (a) providing a dose of a first reactant to a reaction chamber, (b) purging the reaction chamber, (c) providing a flow of a second reactant, (d) igniting a continuous wave plasma in the reaction chamber, and (e) extinguishing the plasma and purging the reaction chamber. As a result of the nature of precursor delivery/adsorption onto the substrate surface, a single cycle of a PEALD process deposits a monolayer of material. The operations may be repeated a number of times to deposit additional monolayers to reach a desired film thickness.

SUMMARY

Certain embodiments herein relate to techniques depositing conformal film layers on semiconductor or other substrates. In one aspect of the embodiments herein, a method is provided for filling a gap on a semiconductor substrate surface, the method including: (a) introducing a first reactant in vapor phase into a reaction chamber having the substrate therein, and allowing the first reactant to adsorb onto the substrate surface; (b) purging the reaction chamber after a flow of the first reactant has ceased; (c) introducing a second reactant in vapor phase into the reaction chamber while the first reactant is adsorbed onto the substrate surface; (d) exposing the substrate surface to plasma to drive a surface reaction between the first and second reactants on the substrate surface to form a film layer that lines the gap, where the plasma is a pulsed plasma; (e) extinguishing the plasma; and (f) purging the reaction chamber.

In some embodiments, the frequency of the plasma pulses during exposing the substrate surface to plasma is between about 25-5000 Hz. The frequency of plasma pulses may also be between about 100-500 Hz. In some cases, the frequency of plasma pulses is at least about 25 Hz, for example at least about 50 Hz or at least about 100 Hz or at least about 1000 Hz. Various different types of film may be deposited according to the disclosed methods. In some implementations, the film deposited is a silicon nitride or silicon carbonitride film. The film may be an oxide film in some cases.

In certain cases, operations (c) and (d) occur, at least partially, at the same time. Different types of plasma may be used. In some embodiments, the plasma may be a capacitively coupled plasma or an inductively coupled plasma. The plasma may be generated using an RF plasma generator. In some implementations, a plasma power may be between about 50-2500 W/station.

The disclosed method achieves a deposited film that is highly uniform in quality. In some embodiments, a ratio between a wet etch rate at a middle portion of a sidewall of the gap (WEm) and a wet etch rate at a top (WEt) and/or bottom (WEb) of the gap is between about 0.25-3. The film formed in the gap at a middle portion of the gap, as measured vertically, may exhibit a wet etch rate between about 1-25 Å/min. An average ratio of carbon:silicon at a sidewall of the gap may be at least about 0.4, for example at least about 0.5 or 0.6. This relatively high carbon:silicon ratio contributes to the relatively low wet etch rate seen at the sidewalls. In various embodiments, a composition of the film is substantially uniform throughout the film.

In some embodiments, the method further includes repeating operations (a) through (f). In some cases, a first iteration of operation (d) is performed at a different pulse frequency than a second iteration of operation (d). Alternatively or in addition, a first iteration of operation (d) may be performed at a different duty cycle than a second iteration of operation (d). Further, a first iteration of operation (d) may be performed at a different RF power than a second iteration of operation (d).

In the disclosed embodiments, a pulsed plasma is used. In some cases, the plasma pulses between an on state and an off state. In other cases, the plasma may pulsed between at least a first power state and a second power state, where power delivered during the first power state is different from power delivered during the second power state.

In a further aspect of the disclosed embodiments, an apparatus for depositing films on substrates is provided, including: a reaction chamber; an inlet port for delivering gas phase reactants to the reaction chamber; a plasma generator for providing pulsed plasma to the reaction chamber; and a controller having instructions for: (a) introducing a first reactant in vapor phase into the reaction chamber; (b) introducing a second reactant in vapor phase into the reaction chamber; (c) periodically striking a pulsed plasma to expose the substrate surface to pulsed plasma when the vapor phase flow of the first reactant has ceased in order to drive a surface reaction between the first and second reactants on the substrate surface to form the film.

In some embodiments the controller has instructions for pulsing the plasma during operation (c) at a frequency between about 25-5000 Hz. The controller may have instructions for performing operations (b) and (c) at least partially at the same time. The controller may also have instructions for performing operation (c) at a plasma duty cycle between about 5-95%. In certain cases, the controller may have instructions for repeating operations (a) through (c), where the controller also has instructions for performing a first iteration of operation (c) at a different pulse frequency and/or duty cycle and/or RF power than a second iteration of operation (c).

These and other features will be described below with reference to the associated drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 5A and 5B show cross-sectional views of a trench having a conventional film deposited thereon, both as-deposited (FIG. 5A) and after an etching operation (FIG. 5B).

FIG. 5C is a table showing the etch rate at different portions of the conventional film shown in FIGS. 5A and 5B.

FIGS. 6A and 6B show cross-sectional views of a trench having a novel film thereon deposited according to the disclosed methods, both as-deposited (FIG. 6A) and after an etching operation (FIG. 6B).

FIG. 6C is a table showing the etch rate at different portions of the novel film shown in FIGS. 6A and 6B.

DETAILED DESCRIPTION

Figure 1A:
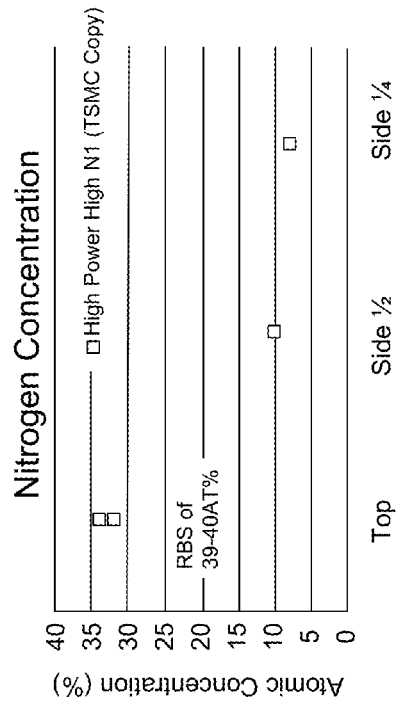
FIGS. 1A-1D show graphs depicting the atomic concentration of various species present in a film deposited in a trench at different positions within the trench.
Figure 1B:
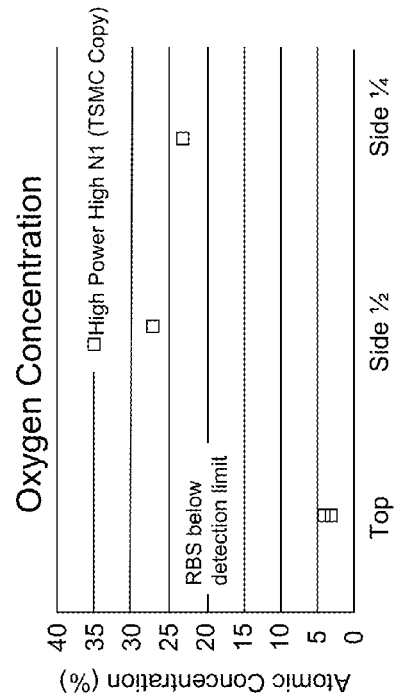
Figure 1C:
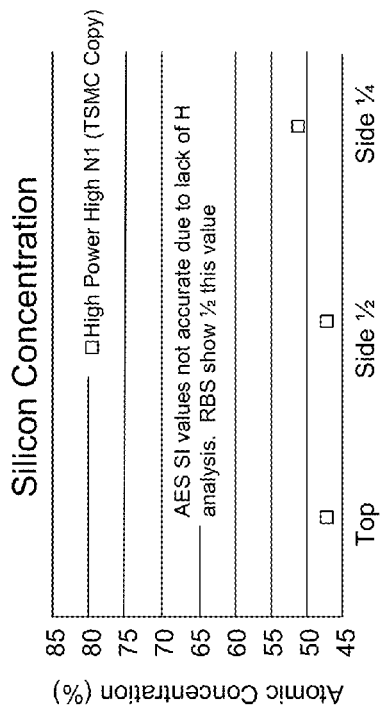

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Manufacture of semiconductor devices typically involves depositing one or more thin films on a non-planar substrate in an integrated fabrication process. In some aspects of the integrated process it may be useful to deposit thin films that conform to substrate topography. For example, a silicon nitride film may be deposited on top of an elevated gate stack to act as a spacer layer for protecting lightly-doped source and drain regions from subsequent ion implantation processes.

In spacer layer deposition processes, chemical vapor deposition (CVD) processes may be used to form a silicon nitride film on the non-planar substrate, which is then anisotropically etched to form the spacer structure. However, as a distance between gate stacks decreases, mass transport limitations of CVD gas phase reactions may cause "bread-loafing" deposition effects. Such effects typically exhibit thicker deposition at top surfaces of gate stacks and thinner deposition at the bottom corners of gate stacks. Further, because some die may have regions of differing device density, mass transport effects across the wafer surface may result in within-die and within-wafer film thickness variation. These thickness variations may result in over-etching of some regions and under-etching of other regions. This may degrade device performance and/or die yield. A further problem that arises with CVD processes is that they are often unable to form conformal films in high aspect ratio features. In certain contexts, a feature is a gap recessed in the surface of a substrate, for example a gap in one or more films deposited on a substrate. The aspect ratio of a feature is defined as the ratio between the feature's depth to its width. As device dimensions continue to shrink, aspect ratios increase and CVD processes are unable to adequately fill such features.

Some approaches to addressing these issues involve atomic layer deposition (ALD). In contrast with a CVD process, where thermally activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, thermal energy provided to the substrate activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness.

Depending on the exposure time of the precursor dosing steps and the sticking coefficients of the precursors, each ALD cycle may deposit a film layer of, in one example, between about 0.5-3 Å thick.

Conformal films may also be deposited on planar substrates. For example, antireflective layers for lithographic patterning applications may be formed from planar stacks comprising alternating film types. Such antireflective layers may be approximately 100-1000 Å thick, making slower ALD processes less attractive than faster CVD processes. However, such anti-reflective layers may also have a lower tolerance for within-wafer thickness variation than many CVD processes may provide. For example, a 600 Å thick antireflective layer may tolerate a thickness range of less than 3 Å.

In some implementations, conformal film deposition (CFD) processes may be employed. Methods for forming films using CFD are described in U.S. patent application Ser. No. 13/084,399, filed on Apr. 11, 2011, and which is incorporated by reference herein for all purposes. Like ALD processes, CFD processes use surface-mediated deposition reactions to deposit films on a layer-by-layer basis. Generally, CFD does not rely on complete purges of one or more reactants prior to reaction to form the film. For example, there may be one or more reactants present in the vapor phase when a plasma (or other activation energy) is struck. Accordingly, one or more of the process steps described in an ALD process may be shortened or eliminated in an example CFD process. Further, in some embodiments, plasma activation of deposition reactions may result in lower deposition temperatures than thermally-activated reactions, potentially reducing the thermal budget of an integrated process. The embodiments herein include both plasma enhanced ALD (PEALD) and CFD processes.

Conventional PEALD processes result in the deposition of conformal films having substantially uniform thickness. However, although the films are uniform in thickness, they are not uniform in quality. In many cases, the film deposited on the sidewall of a recessed feature is of poorer quality than the film deposited in the field region near the top of the feature or at the bottom of the feature. This poor quality is evidenced by increased oxidation and increased wet etch rate of the film at the sidewalls compared to the film near the top or bottom of the feature.

FIGS. 1A-1D present data from an Auger analysis related to the composition of a film deposited in a trench on a substrate according to a conventional PEALD method. In each of these figures, the x-axis relates to different locations on the substrate. "Top" refers to a position in the field region near the top of a recessed feature, "Side ½" refers to a position halfway up the sidewall, and "Side ¼" refers to a position one-quarter of the way up the sidewall (closer to the bottom of the feature than the top). The y-axis relates to the atomic concentration of the element of interest (silicon in FIG. 1A, nitrogen in FIG. 1B, carbon in FIG. 1C, and oxygen in FIG. 1D).

Figure 1D:
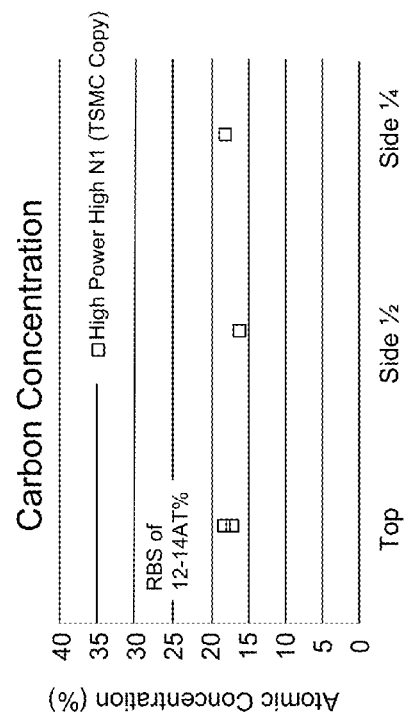

Of particular interest is FIG. 1D, which shows that the concentration of oxygen in the film is much higher at the sidewall locations than in the field region. After a film is deposited, it is removed from the reaction chamber where it is often exposed to atmospheric conditions. Films that have low density, and certain other poor quality films, absorb moisture and other atmospheric contaminants to a greater degree than high density, high quality films. Thus, the amount of oxygen incorporated into the film corresponds to the quality of the film. In FIG. 1D, it is clear that substantially more oxygen was incorporated into the sidewalls (about 23-27% oxygen) compared to the field region (about 4% oxygen). This indicates that the film quality was much poorer on the sidewalls than at the field region.

FIGS. 1A-1D contain references to "RBS" values. These correspond to Rutherford Backscattering data performed to verify the Auger analysis. The RBS data relates only to the film at the top of the feature.

Further data related to the wet etch rate of a silicon carbonitride film at different film/feature locations is provided in the Experimental section, below. To briefly summarize, for the conventionally deposited film, the wet etch rate in 100:1 water:HF was much higher at the sidewalls than at the top of the feature, which was higher still than at the bottom of the feature. Thus, it is apparent that although conventional PEALD methods achieve films of uniform thickness, they do not deposit films of uniform quality or composition.

While conventional PEALD methods utilize a continuous wave plasma during the plasma exposure/conversion step, the embodiments herein relate to methods in which the plasma is pulsed (e.g., RF power is turned on and off or otherwise modulated many times) during this conversion operation. Although conventional PEALD methods are sometimes described as "pulsed plasma" methods, a distinction should be drawn between these conventional pulses and the pulses of the current embodiments. In particular, conventional PEALD methods use a single pulse (plasma on, plasma off) during a plasma exposure/conversion step. Because the PEALD process is cyclic and the plasma exposure step is repeated several times during a deposition process, some may refer to these conventional processes as pulsed plasma processes. However, these conventional methods are not considered to use a "pulsed plasma" with respect to the current description. To qualify as a pulsed plasma, the plasma must be turned on and off or otherwise modulated multiple times during a single plasma exposure/conversion operation. For example, the high frequency RF power of the plasma may switch between an on state and an off state. In another example, the RF power may be reduced but not turned off during the pulses. For example, the high frequency RF power pulses could be 100% of the high frequency RF power when the pulse is on and 50% of the high frequency RF power when the pulse is off. In addition, or in the alternative, the high frequency RF power of the plasma may be increased over a period of time and decreased over a period of time instead of being turned on and off. The plasma pulses are generally very short, with a pulse frequency on the order of about 100 Hz-500 Hz, though values outside this range may be used as well. Films produced according to the disclosed methods show much higher quality at the sidewalls compared to conventionally deposited films. This increase in sidewall film quality means that the deposited films have much more uniform quality overall.

Without wishing to be bound by theory or mechanism of action, it is believed that the difference in film quality between the sidewalls of a feature and other areas of a feature in conventional PEALD methods may arise due to the nature of ion directionality. When a substrate is exposed to plasma, ions present in the plasma travel in a substantially linear manner to hit the surface of the substrate. These ions may provide energy for converting the precursor material(s). Because the feature is recessed and the ions travel substantially linearly, the density of ions impacting the substrate is much higher near the field region and at the bottom of a feature, as compared to the sidewalls. This may act to selectively density the film near the top and bottom of the feature, leaving a less dense film on the sidewalls. Further, the energy delivered by ions hitting the sidewalls is different from the energy delivered by ions hitting other portions of the feature, again due to the geometry of the recessed feature. This may lead to different reactions happening at the sidewalls than at other regions. The use of a pulsed plasma may decrease the directionality of the ions, resulting in more uniform ion impact density/energy on the substrate, and more uniform film quality.

Again without wishing to be bound by theory or mechanism of action, the difference in film quality at different locations may also result from the ratio of ions to radicals in the plasma. By pulsing the plasma, a different amount, ratio and type of ions and neutrals may be achieved. This may help form a more uniform quality film.

Figure 1E:
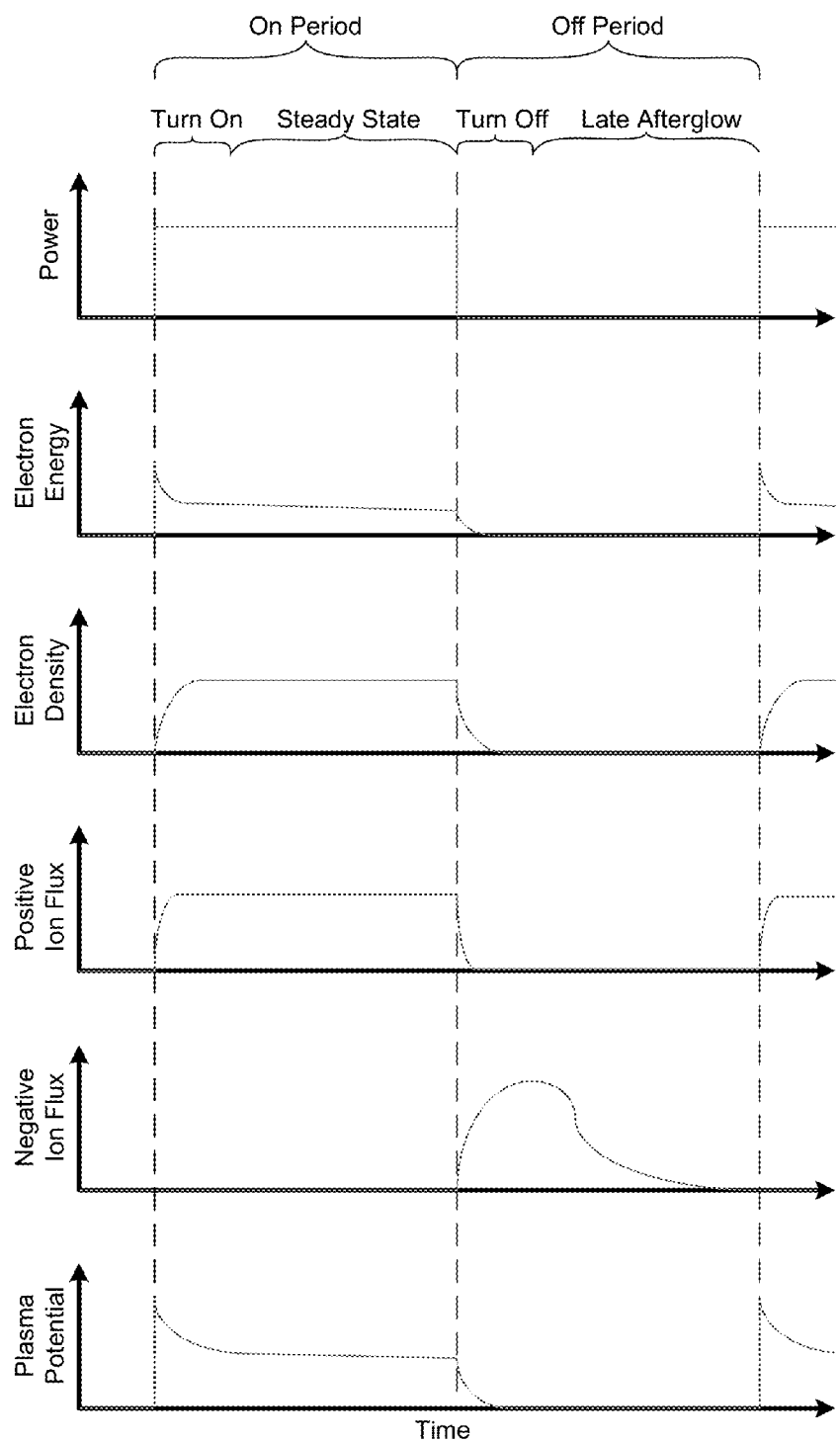
FIG. 1E shows various graphs depicting how different plasma characteristics change over time during a plasma pulse cycle.

Several different processing regimes may be achieved when a plasma is pulsed. These regimes are described below with reference to FIG. 1E, which shows how various processing and plasma characteristics may change over time during a plasma pulse cycle in some implementations. One plasma pulse cycle includes turning the plasma power on and off once (or off and on once). The power used to drive the RF plasma is shown in FIG. 1E. Plasma power is actively applied during the on period, but not during the off period. The on and off periods may be further broken down into specific processing regimes, including a turn on regime, a steady state regime, a turn off regime and a late afterglow regime. The electron energy, electron density, positive and negative ion fluxes, and plasma potential vary based which plasma cycle processing regime the plasma is currently experiencing.

The turn on cycle begins upon application of plasma power. This period may last on the order of about 10-500 µs in some embodiments. When plasma power is applied, the electron energy in the plasma jumps and then quickly begins to fall. The density of electrons rises during this time. Plasmas generally contain ions, electrons and radicals. To satisfy the charge balance, more of the ions present in the plasma are positively charged than negatively charged. This is because positive ions are the only positive species in the plasma, while the negative species include both negative ions and electrons. Further, many plasmas, including electronegative plasmas, have an electropositive edge/sheath region. Because the density of positive ions is greater than the density of negative ions, and because the plasma sheath is electropositive, the flux of negative ions to the surface of a substrate while plasma is activated is very low (e.g., substantially zero). Turning back to FIG. 1E, when plasma power is applied, the plasma potential jumps and then begins to fall off. During the turn on processing regime, plasma sheaths may be forming and changing with plasma ignition.

During the steady state processing regime, the electron energy is lower than it was during the turn on regime. Both electron energy and electron density are fairly constant. The positive and negative ion fluxes are also constant during this regime, with a high positive ion flux and a very low (e.g., substantially zero) negative ion flux. The plasma potential is fairly steady, and is lower in the steady state regime than during the turn on regime. During the steady state processing regime, plasma sheaths may be oscillating in a steady state fashion.

The turn off processing regime begins as soon as the plasma power is turned off. During this period, the electron energy, electron density, positive ion flux and plasma potential all begin to fall off. The plasma sheaths may be disintegrating with the decline of the electron density during the turn off regime. Notably, the negative ion flux may rise during this processing regime. As mentioned above, many plasmas have an electropositive edge region. In order to extract negative ions from the plasma, this edge region should be changed by reversing the direction of the electric field for a sufficiently long period of time to allow the negative ions to escape. To reverse the electric field, the electron current must be absorbed. This current can be very substantial in the context of a continuous wave plasma. However, this current decreases as the electron density decreases. Where a pulsed plasma is used, electron density decreases quickly during the turn off regime, and remains low during the late afterglow regime. The low electron density during these regimes makes it significantly easier to reverse the direction of the electric field and extract negative ions from the plasma. As such, without wishing to be bound by theory or mechanism of action, one explanation for the improvement in film quality seen with regard to pulsed plasma deposition may arise from the increased participation of negative ions in the deposition process.

The next processing regime experienced after the turn off regime is the late afterglow regime. During this time, the plasma power, electron energy, electron density, positive ion flux and plasma potential are very low, in some cases zero. The electron density is very low, for example near the thermal electron average energy. The ion flux density is similarly low, with little to no positive ions reaching the surface of a substrate. As indicated above, however, there may be a flux of negative ions to the surface of the substrate during this time. In some cases, the plasma potential may be zero or even negative during the late afterglow regime.

Another potential explanation for the difference in film quality is that film byproducts may get selectively buried in the film at different locations, particularly at the sidewalls. The use of a pulsed plasma may allow these byproducts to be removed from the film more effectively, thus creating a more uniform quality film.

Pulsed plasmas have been used in certain other contexts for other purposes. For example, a plasma may be pulsed during a plasma enhanced chemical vapor deposition process in order to enhance conformality of the deposited film. This pulsed PECVD process is further discussed and described in U.S. Pat. No. 7,745,346, titled "METHOD FOR IMPROVING PROCESS CONTROL AND FILM CONFORMALITY OF PECVD FILM," which is incorporated herein in its entirety. However, because ALD and CFD methods deposit films that are inherently very conformal, one of ordinary skill in the art would not likely apply these pulsed plasma methods to an ALD/CFD process, as there would be little or no expected benefit in this context.

While many of the embodiments herein are discussed in terms of depositing SiN or SiCN films, the embodiments are not so limited. In other cases, the deposited film may be an oxide (e.g., silicon oxide or a metal oxide). Each of these types of films suffers from poor quality film on the sidewalls when deposited according to conventional continuous wave plasma processing methods. In certain embodiments, the film deposited may be doped, for example with carbon, boron, phosphorus, nitrogen, etc.

Figure 2A:
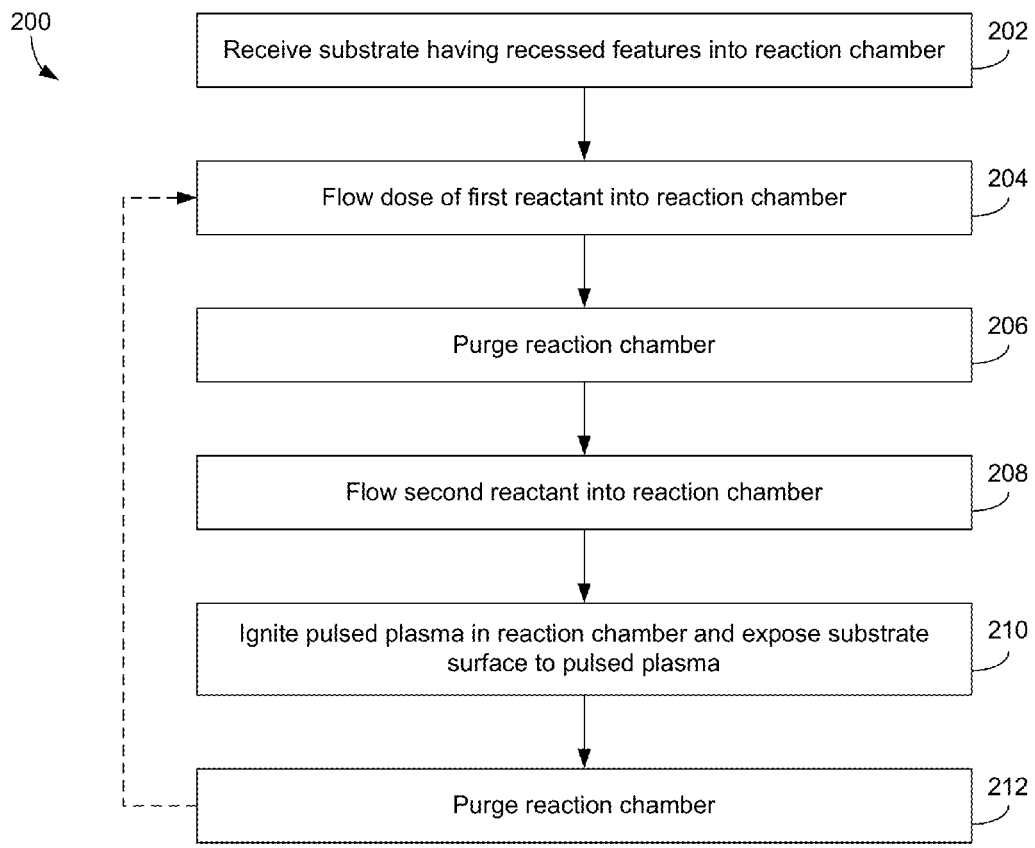
FIGS. 2A and 2B are flowcharts for methods of depositing a film on a substrate through a plasma enhanced atomic layer deposition method according to certain disclosed embodiments.

FIG. 2A shows a flowchart of a method of depositing a uniform-quality film according to various disclosed embodiments. The method 200 begins at operation 202, where a substrate having recessed features is received into a reaction chamber. At operation 204, a dose of a first reactant is flowed into the reaction chamber. The reactant adsorbs onto the surface of the substrate, including in the recessed features. Where the film being deposited contains silicon, the first reactant is typically a silicon-containing reactant. Where the film being deposited contains a metal, the first reactant is generally a metal-containing reactant. Next, the reaction chamber is purged at operation 206. In some embodiments, the purge includes sweeping the reaction chamber with a non-reactive gas. Alternatively or in addition, the purge may include evacuating the reaction chamber by performing a pump down. In this case, the pressure in the reaction chamber is significantly lower during the pump down than during reactant delivery, for example. The purpose of this purge operation 206 is to remove all or substantially all of the first reactant from the reaction chamber. In some embodiments, the purge/sweep may be less complete, where only a portion of the first reactant is removed from the reaction chamber. Optimal purge conditions may depend on the desired film characteristics. Unless otherwise stated, a sweep or purge as described herein may be partial, complete or substantially complete. In certain implementations, this purge/sweep may not occur. Next, at operation 208, a second reactant is flowed into the reaction chamber. The second reactant is often a nitrogen-containing reactant, carbon-containing reactant, and/or oxygen-containing reactant.

Each of the first and second reactants may also be a mix of reactants. In one example, the second reactant may include both oxygen and nitrous oxide. Where more than one reactant is delivered to the reaction chamber at the same time, the reactants may be mixed prior to delivery (e.g., in a separate mixing vessel), or after delivery (e.g., in the reaction chamber itself).

At operation 210, a pulsed plasma is ignited in the reaction chamber and exposed to the substrate surface. The frequency of the pulses is relatively high, for example on the order of about 100-500 Hz. The pulsed plasma exposure operation 210 may have a longer duration than what is typically used in a conventional continuous wave plasma process. In various embodiments, operations 208 and 210 occur, at least partially, at the same time. In some cases, the second reactant may be pre-flowed into the reaction chamber at 208 before plasma ignition occurs at 210. In a particular example, the second reactant is provided continuously. In other embodiments, operations 208 and 210 begin at the same time. In alternative embodiments, the second reactant is flowed into the reaction chamber at 208, then swept/purged from the reaction chamber before pulsed plasma ignition occurs at operation 210. In various cases, however, this purge may not occur.

Next, the plasma is extinguished and the reaction chamber is purged at operation 212. As mentioned with respect to the purge at operation 206, this may include sweeping and/or pumping down the reaction chamber. In certain cases this sweep/purge may be optional, though the use of a post-plasma purge may help promote formation of high quality film. Operations 204-212 generally result in the deposition of a monolayer of material, though in certain embodiments, less than a monolayer of material may be deposited. These steps may be repeated a number of times in order to grow a film of the desired thickness, as indicated by the dotted arrow.

As indicated, the plasma characteristics can have a substantial effect on the deposited film. In many embodiments, the plasma is a capacitively coupled plasma. However, other types of plasma may also be used, for example inductively coupled plasmas. Various types of plasma generators may be used including RF, DC and microwave plasma generators. The plasma may be either a direct plasma (i.e., a plasma generated in the reaction chamber), or a remotely-generated plasma.

With currently manufactured high frequency RF power generators, the high frequency RF power of a plasma may be pulsed between about 75-500 Hz. These generators are not capable of a sustaining a plasma at duty cycles lower than 15% or pulse frequencies greater than 500 Hz. Further improvements in the films might be observed using the pulsed PEALD process with further decreases in duty cycle when generators capable of higher frequencies and lower duty cycles become available. However, with increases in pulse frequency and decreases in duty cycle, the high frequency RF power of the plasma must be on at least long enough to generate reactive species. If no reactive species are generated, the benefits of pulsed PEALD will not be realized.

The plasma power delivered may be between about 50-2500 W/station, for example between about 75-500 W/station for a 300 mm diameter wafer. These values may be scaled linearly based on the area of a substrate for substrates of different sizes. For example, a value of 100 W/station for a 300 mm wafer would correspond to a value of 225 W/station for a 450 mm wafer.

Where an RF plasma is used, the RF frequency may include a low frequency (LF) component (e.g., about 250-400 kHz) and/or a high frequency (HF) component (e.g., about 13.56 or 27 MHz). In certain embodiments, the inclusion of an LF frequency undesirably reduces step coverage. As such, in certain embodiments, the RF delivered includes only HF frequencies.

The duty cycle relates to the relative amount of time that a plasma is ignited during the pulsed plasma exposure phase. For example, for a pulse with a frequency of 500 Hz and a duty cycle of 15%, one pulse period is 2 ms with the RF power off for 1.7 ms and on for 0.3 ms. In some embodiments, the duty cycle is between about 5-95%. In certain cases, the duty cycle is between about 5-50%, or between about 5-15%, for example about 10%. The duration of each plasma pulse is fairly short and the frequency of plasma pulses is relatively high. In some cases, the plasma pulse frequency is between about 25-5000 Hz, for example between about 100-500 Hz. In some cases, the pulse frequency is about 1000 Hz or less, for example about 500 Hz or less. In these or other cases, the pulse frequency is about 25 Hz or greater, for example about 50 Hz or greater, or about 100 Hz or greater. The duration of the entire plasma exposure operation may be higher than in continuous wave plasma PEALD processes. In some cases, the duration of the pulsed plasma exposure is between about 0.05-2 seconds, for example between about 0.05-1 second, or between about 0.1-0.5 seconds.

In certain embodiments, the plasma pulse characteristics may be changed over time. For example, the pulse frequency and/or duty cycle may change between a first set of deposition cycles and a second set of deposition cycles. In some embodiments, a pulse frequency is increased or decreased in later cycles. In these or other cases, the duty cycle may increase or decrease in later cycles. Other plasma characteristics may change over time within a deposition process, as well. For instance, the RF power value, RF frequency, plasma generating gas, etc. may be changed during a deposition process.

Figure 2B:
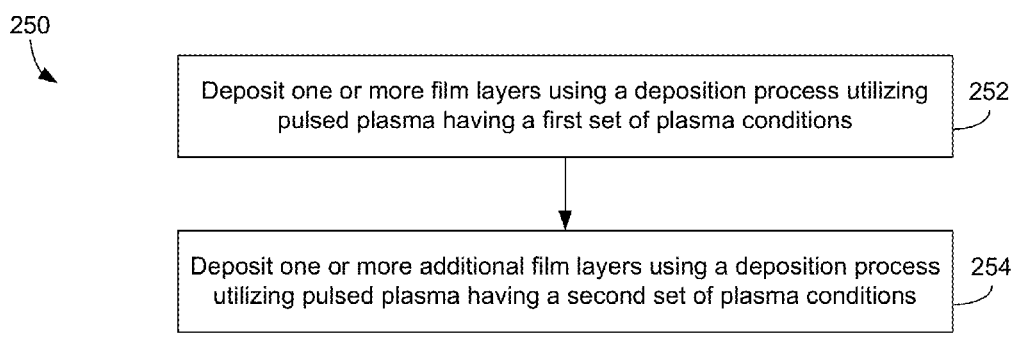

FIG. 2B provides a flowchart for a method of depositing a film on a substrate where the plasma conditions are changed during the deposition. The method 250 begins at operation 252, where one or more layers of film are deposited using a deposition process utilizing pulsed plasma having a first set of plasma conditions, as described herein. Next, the method 250 continues at operation 254, where one or more additional film layers are deposited using a deposition process utilizing pulsed plasma having a second set of plasma conditions. The first and second set of plasma conditions may be different. As mentioned, one or more of the following plasma characteristics may be different between operations 252 and 254: pulse frequency, duty cycle, RF power, RF frequency, composition or flow rate of gas used to generate plasma, etc. Changing the plasma characteristics may help tune a film as desired.

While the disclosed embodiments are not limited to particular reactants, an example list of reactants is provided below.

In certain embodiments, the deposited film is a silicon-containing film. In these cases, the silicon-containing reactant may be for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, tetra-ethyl-ortho-silicate (also known as tetra-ethoxy-silane or TEOS) and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane (HSiCl$_3$), dichlorosilane (H$_2$SiCl$_2$), monochlorosilane (ClSiH$_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane (H$_3$Si(NH$_2$)$_4$, H$_2$Si(NH$_2$)$_2$, HSi(NH$_2$)$_3$ and Si(NH$_2$)$_4$, respectively), as well as substituted mono-, di-, tri- and tetra-aminosilanes, for example, t-butylaminosilane, methylaminosilane, tert-butylsilanamine, bis(tertiarybutylamino)silane (SiH$_2$(NHC(CH$_3$)$_3$)$_2$ (BTBAS), tert-butyl silylcarbamate, SiH(CH$_3$)—(N(CH$_3$)$_2$)$_2$, SiHCl—(N(CH$_3$)$_2$)$_2$, (Si(CH$_3$)$_2$NH)$_3$ and the like. A further example of an aminosilane is trisilylamine (N(SiH$_3$)$_3$).

In other cases, the deposited film contains metal. Examples of metal-containing films that may be formed include oxides and nitrides of aluminum, titanium, hafnium, tantalum, tungsten, manganese, magnesium, strontium, etc., as well as elemental metal films. Example precursors may include metal alkylamines, metal alkoxides, metal alkylamides, metal halides, metal β-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent. Further examples of metal-containing precursors that may be employed include trimethylaluminum, tetraethoxytitanium, tetrakis-dimethylamido titanium, tetrakis-diethylamido-titanium, titanium isopropoxide, titanium tetraisopropoxide, titanium tetrachloride, bis(methyl-η5-cyclopentadienyl)dimethylhafnium, bis(methyl-η5-cyclopentadienyl)methoxymethylhafnium, hafnium(IV) tert-butoxide, tetrakis(dimethylamido)hafnium (IV), hafnium tetrakis(ethylmethylamide), bis(cyclopentadienyl)manganese, bis(n-propylcyclopentadienyl)magnesium, tantalum(V) ethoxide, tris(diethylamido)(tert-butylimido)tantalum(V), bis(tert-butylimino)bis(dimethylamino)tungsten(VI), tungsten hexacarbonyl, etc.

In certain implementations, an oxygen-containing reactant is used. Examples of oxygen-containing reactants include oxygen, ozone, nitrous oxide, nitric oxide, nitrogen dioxide, carbon monoxide, carbon dioxide, sulfur monoxide, sulfur dioxide, water, oxygen-containing hydrocarbons (C$_x$H$_y$O$_z$), etc.

In some embodiments, the deposited film contains nitrogen, and a nitrogen-containing reactant is used. A nitrogen-containing reactant contains at least one nitrogen, for example, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

Other precursors, such as will be apparent to or readily discernible by those skilled in the art given the teachings provided herein, may also be used.

It is expected that the disclosed embodiments will be beneficial in achieving uniform film quality in recessed features. However, the methods may also be used to deposit films on other types of substrates (e.g., flat substrates, or substrates having protruding features). The need for the improved sidewall quality and overall film uniformity may not be as great in the context of these types of non-recessed substrates.

In some embodiments, the substrate includes one or more recessed features having aspect ratios of about 6:1 or less. This ratio is defined as the depth:width of the recessed feature. In other cases, the aspect ratio of the features may be higher.

The temperature of the reaction chamber during the deposition process may be between about 150-550° C., for example between about 250-550° C. This temperature is substantially lower than that typically required when thermal energy is used to convert the precursors (e.g., >700° C.), rather than plasma energy.

The pressure of the reaction chamber during the deposition process may be between about 1-10 Torr, or between about 3-7 Torr, for example about 6 Torr.

As compared to a conventional continuous wave process, the disclosed pulsed plasma embodiments will typically exhibit a slower deposition rate.

The disclosed methods also result in the deposition of films having relatively tensile or neutral stress with very low wet etch rates. In contrast, conventional methods typically result in the deposition of compressive films having low wet etch rates or tensile films having very high wet etch rates. With conventional continuous wave plasmas, the wet etch rate can be varied by using different levels of RF power. Higher levels of RF power (e.g., about 6500 W/station) result in highly compressive films having low wet etch rates. Lower levels of RF power (e.g., about 500 W/station) result in films that are less compressive/more tensile, however, these films have extremely high wet etch rates. In contrast, films produced by the disclosed pulsed plasma methods are very close to neutral stress, and in some cases have slightly tensile stress. At the same time, these films exhibit very low wet etch rates, in many cases lower than what was achievable at high RF power with continuous wave plasmas. In some embodiments, the wet etch rate of the film as-deposited at the middle portion of a sidewall may be between about 1-25 Å/min, for example between about 1-10 Å/min. These values may be especially relevant when the film deposited is a carbon doped silicon nitride film. Another way to characterize the deposited films is to examine internal wet etch rate ratios that compare the wet etch rates at different portions of the deposited film. For instance, the wet etch rate at the middle portion of the feature's sidewall (WE$_m$) may be compared to the wet etch rate at the bottom (WE$_b$) and/or top (WE$_t$) of the feature. These film locations are shown in FIGS. 5A and 5B, which are further described below. In some embodiments, WE$_m$/WE$_b$ and/or WE$_m$/WE$_t$ are between about 0.25-3, for example between about 0.25-2, or between about 0.25-1. In the case of a continuous wave plasma, these ratios are generally much higher, for example between about 5-10 or greater. The stress of the as-deposited film may vary widely, for example the stress may be between about 500 MPa tensile and about 2 GPa compressive.

Apparatus

Pulsed plasma processing can be performed with existing semiconductor processing equipment by using a high frequency RF generator capable of pulsing the high frequency and/or low frequency RF power of the plasma. In particular, reactors such as Vector™ reactor chambers available from Lam Research Corporation of Fremont, Calif., may be used for pulsed PEALD. Thus, improved films may be made with minimal hardware alterations.

A suitable apparatus for performing the disclosed methods typically includes hardware for accomplishing the process operations and a system controller having instructions for controlling process operations in accordance with the present invention. For example, in some embodiments, the hardware may include one or more PEALD process stations included in a process tool.

Figure 3:
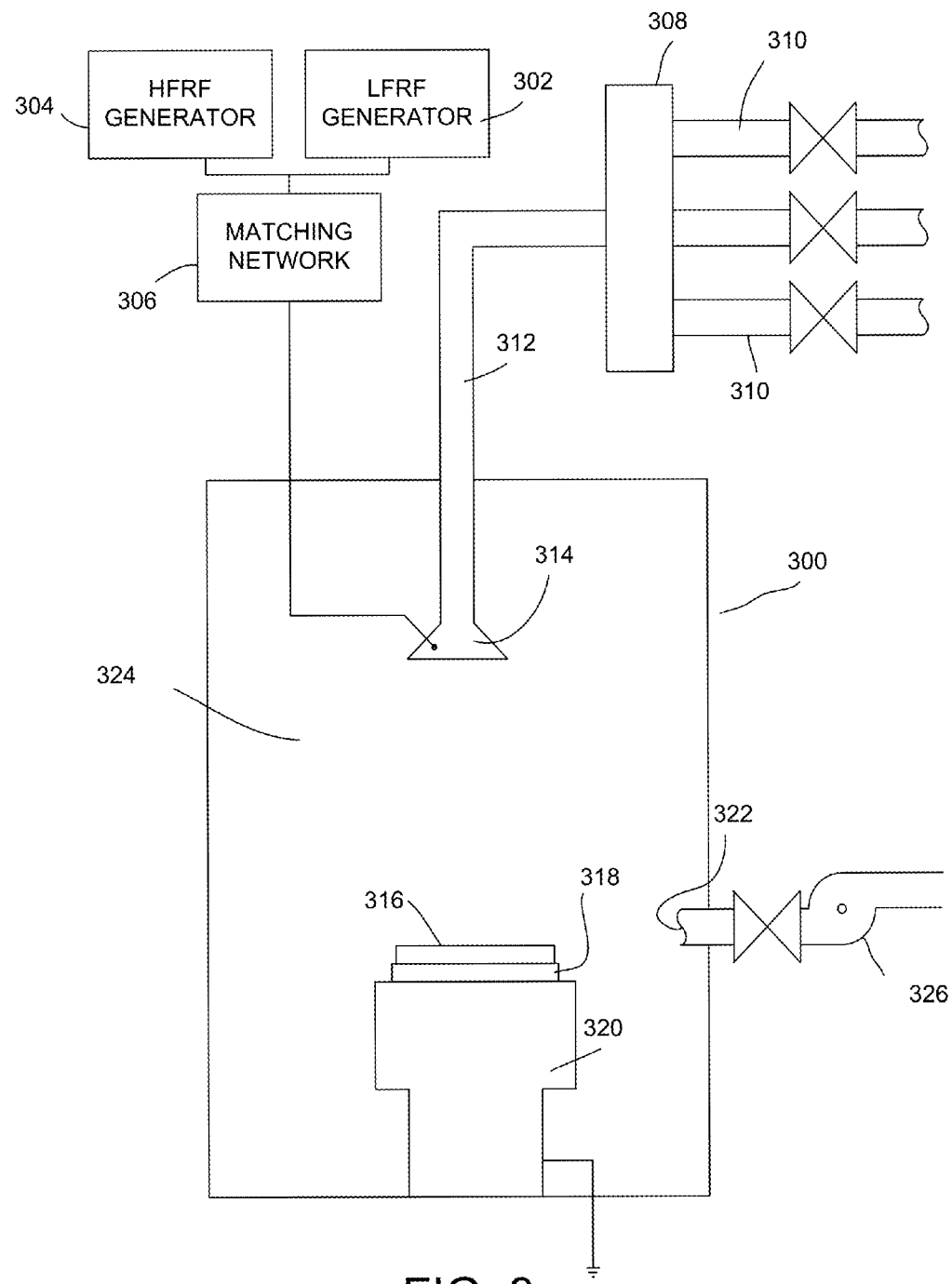
FIG. 3 is a simplified diagram of an apparatus for depositing a film on a substrate according to certain disclosed embodiments.

FIG. 3 provides a block diagram of an example apparatus that may be used to practice the disclosed embodiments. As shown, a reactor 300 includes a process chamber 324, which encloses other components of the reactor and serves to contain the plasma generated by, e.g., a capacitor type system including a showerhead 314 working in conjunction with a grounded heater block 320. A high-frequency RF generator 304, connected to a matching network 306, and a low-frequency RF generator 302 are connected to showerhead 314. These RF generators are capable of pulsing a plasma as described herein. The power and frequency supplied by matching network 306 is sufficient to generate a plasma from the process gas, for example 400-700 W total energy. In one implementation of the present invention both the HFRF generator and the LFRF generator are used. In a typical process, the high frequency RF component is generally between about 2-60 MHz; in a preferred embodiment, the HF component is about 13.56 MHz or 27 MHz. The low frequency LF component is generally between about 250-400 kHz; in a particular embodiment, the LF component is about 350 kHz.

Within the reactor, a wafer pedestal 318 supports a substrate 316. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 312. Multiple source gas lines 310 are connected to manifold 308. The gases may be premixed or not. Appropriate valving and mass flow control mechanisms are employed to ensure that the correct gases are delivered during the deposition and plasma treatment phases of the process. In the case that the chemical precursor(s) are delivered in liquid form, liquid flow control mechanisms are employed. The liquid is then vaporized and mixed with other process gases during its transportation in a manifold heated above its vaporization point before reaching the deposition chamber.

Process gases exit chamber 300 via an outlet 322. A vacuum pump 326 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer. It has been shown that film stress is the same in either case. However, conducting multiple depositions/treatments on one station is substantially faster than indexing following each deposition and/or treatment.

Figure 4:
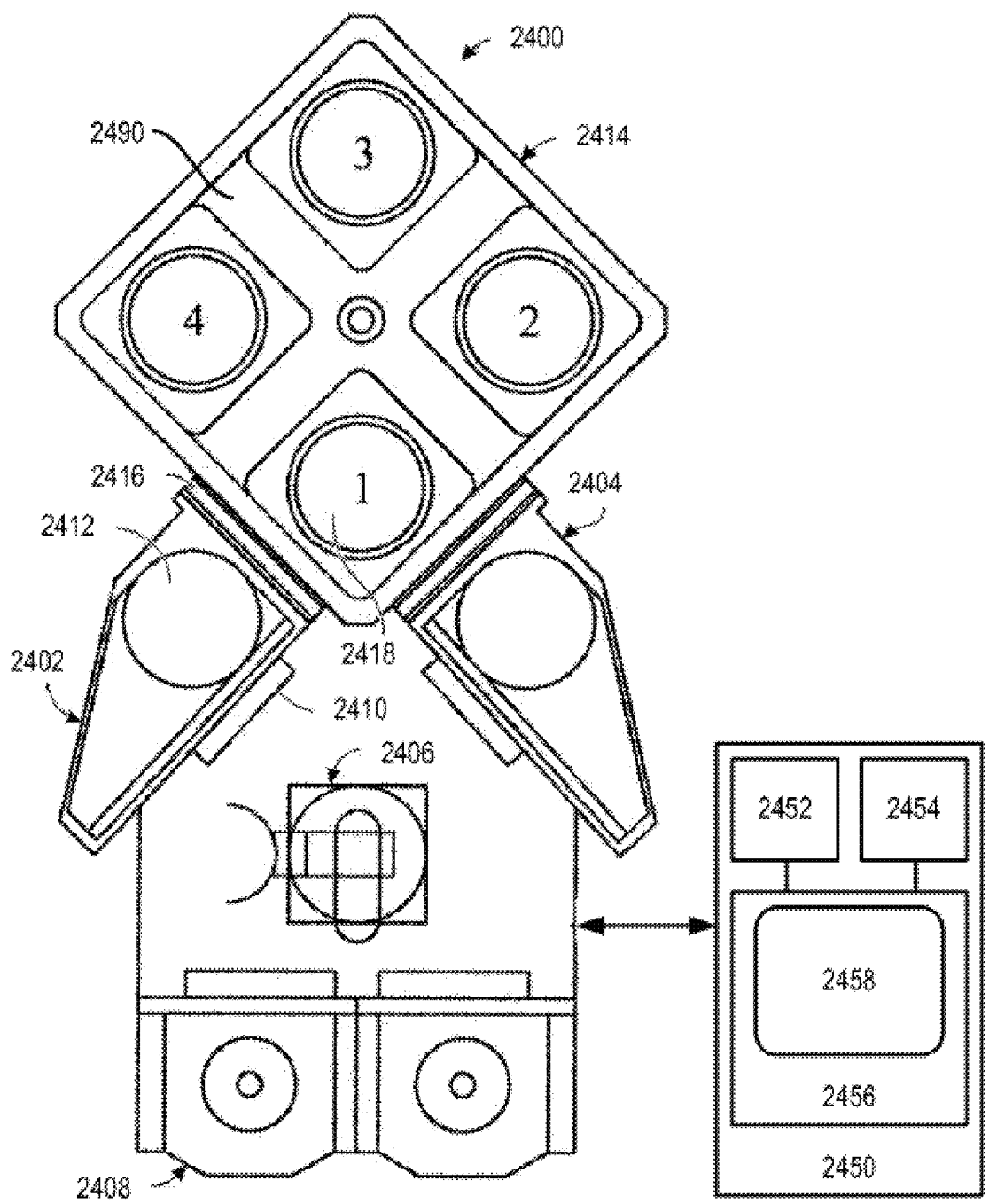
FIG. 4 shows a multi-tool semiconductor processing apparatus for depositing a film on a substrate in accordance with certain disclosed embodiments.

FIG. 4 shows a schematic view of an embodiment of a multi-station processing tool 2400 with an inbound load lock 2402 and an outbound load lock 2404, either or both of which may comprise a remote plasma source. A robot 2406, at atmospheric pressure, is configured to move wafers from a cassette loaded through a pod 2408 into inbound load lock 2402 via an atmospheric port 2410. A wafer is placed by the robot 2406 on a pedestal 2412 in the inbound load lock 2402, the atmospheric port 2410 is closed, and the load lock is pumped down. Where the inbound load lock 2402 comprises a remote plasma source, the wafer may be exposed to a remote plasma treatment in the load lock prior to being introduced into a processing chamber 2414. Further, the wafer also may be heated in the inbound load lock 2402 as well, for example, to remove moisture and adsorbed gases. Next, a chamber transport port 2416 to processing chamber 2414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 2414 comprises four process stations, numbered from 1 to 4 in the embodiment shown in FIG. 4. Each station has a heated pedestal (shown at 2418 for station 1), and gas line inlets. It will be appreciated that in some embodiments, each process station may have different or multiple purposes. While the depicted processing chamber 2414 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 4 also depicts an embodiment of a wafer handling system 2490 for transferring wafers within processing chamber 2414. In some embodiments, wafer handling system 2490 may transfer wafers between various process stations and/or between a process station and a load lock. It will be appreciated that any suitable wafer handling system may be employed. Non-limiting examples include wafer carousels and wafer handling robots. FIG. 4 also depicts an embodiment of a system controller 2450 employed to control process conditions and hardware states of process tool 2400. System controller 2450 may include one or more memory devices 2456, one or more mass storage devices 2454, and one or more processors 2452. Processor 2452 may include a CPU or computer, analog and/or digital input/output connections, stepper motor controller boards, etc.

In some embodiments, system controller 2450 controls all of the activities of process tool 2400. System controller 2450 executes system control software 2458 stored in mass storage device 2454, loaded into memory device 2456, and executed on processor 2452. System control software 2458 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 2400. System control software 2458 may be configured in any suitable way. For example, various process tool component subroutines or control objects may be written to control operation of the process tool components necessary to carry out various process tool processes in accordance with the disclosed methods. System control software 2458 may be coded in any suitable computer readable programming language.

In some embodiments, system control software 2458 may include input/output control (IOC) sequencing instructions for controlling the various parameters described above. For example, each phase of a PEALD process may include one or more instructions for execution by system controller 2450. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase.

Other computer software and/or programs stored on mass storage device 2454 and/or memory device 2456 associated with system controller 2450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 2418 and to control the spacing between the substrate and other parts of process tool 2400.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels and frequencies applied to the process electrodes in one or more process stations. The plasma control program may also include code for controlling the plasma duty cycle and the frequency of plasma pulses during a plasma exposure/conversion operation.

In some embodiments, there may be a user interface associated with system controller 2450. The user interface may include a display screen, graphical software displays of the apparatus and/or process conditions, and user input devices such as pointing devices, keyboards, touch screens, microphones, etc.

In some embodiments, parameters adjusted by system controller 2450 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 2450 from various process tool sensors. The signals for controlling the process may be output on the analog and digital output connections of process tool 2400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 2450 may provide program instructions for implementing the above-described deposition processes. The program instructions may control a variety of process parameters, such as DC power level, RF power level, RF bias power level, RF frequency, plasma pulse frequency, pressure, temperature, etc. The instructions may control the parameters to operate in-situ deposition of film stacks according to various embodiments described herein.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

Experimental

Experimental results show that the disclosed processes may be used to achieve a uniformly high quality film. FIGS. 5A and 5B and 6A and 6B show cross-sectional views of silicon carbonitride films deposited in trenches on a semiconductor substrate as deposited and after etching in 100:1 water:HF for 90 seconds. FIGS. 5C and 6C show tables relating the etch properties of the films shown in FIGS. 5A and 5B and 6A and 6B, respectively.

FIG. 5A shows an as-deposited conventional film. FIG. 5B shows this same film after etching. FIG. 5C shows that the etch rate at the side of the feature was substantially higher than the etch rate at the top of the feature, which was higher than the etch rate at the bottom of the feature. In this case, the etch rate at the sidewall of the feature was approximately ten times higher than the etch rate at the bottom of the feature. Thus, it is apparent that the film at the sidewalls is of poorer quality than the film in other areas of the feature.

FIG. 6A shows an as-deposited film that was deposited according to the disclosed methods, with a pulsed plasma. In this case, the plasma was pulsed at a frequency of about 500 Hz. FIG. 6B shows this same film after it was etched. FIG. 6C relates the wet etch rate of the film shown in FIGS. 6A and 6B. Notably, the wet etch rate at the sidewall is substantially lower than in the conventional case, and the uniformity of the wet etch rate at different portions of the film is significantly improved.

Figure 7B:
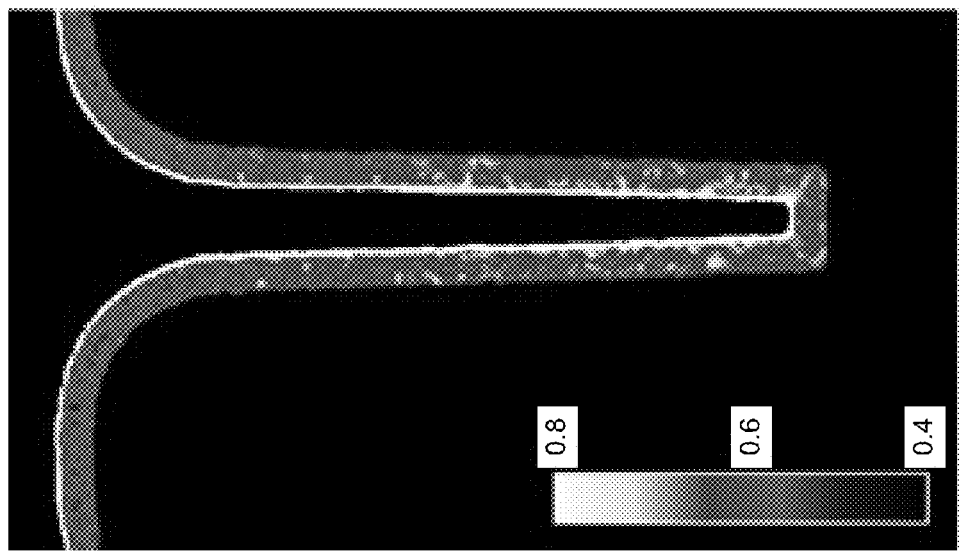
FIGS. 7A and 7B are presented in color and show areal density maps illustrating the carbon:silicon ratio in films deposited with a continuous wave plasma (FIG. 7A) and with a pulsed plasma (FIG. 7B).
Figure 7A:
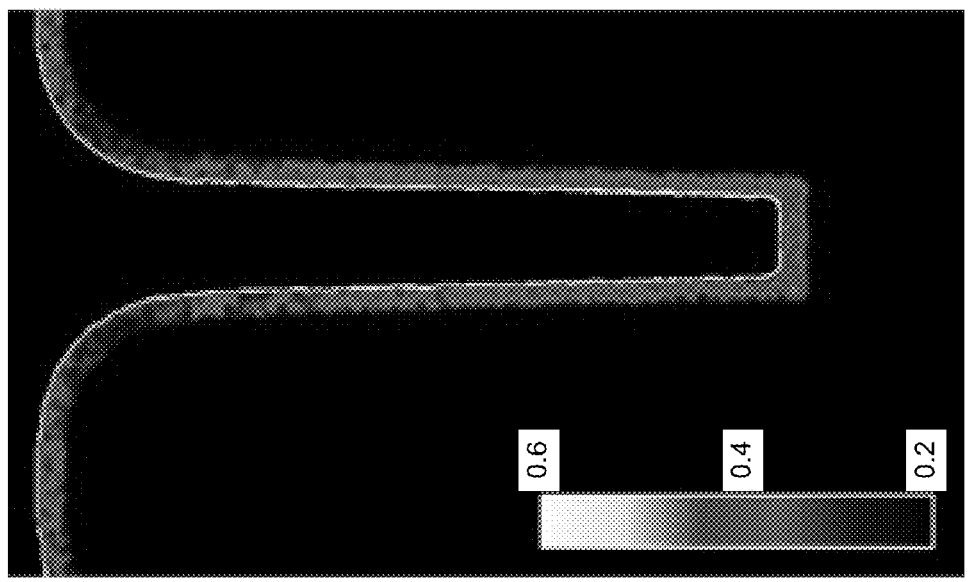

FIGS. 7A and 7B illustrate relative areal density maps for carbon and silicon as measured by STEM-EELs analysis for film deposited with a continuous wave plasma (FIG. 7A) and for film deposited with a pulsed plasma (FIG. 7B). These figures are presented in color for the purpose of illustrating the C:Si ratio at different portions of the deposited films. When comparing the sidewalls of the two films, it is clear that the pulsed plasma film has a higher C:Si ratio than the film prepared with a continuous wave plasma. This higher sidewall C:Si ratio is consistent with the lower wet etch rate observed at the sidewalls of features deposited with pulsed plasma film. In certain embodiments, the sidewalls of the film have a C:Si ratio of at least about 0.4 or 0.5 or 0.6 (on average, as measured in the substantially vertical section of the sidewall, and as measured according to a STEM-EELs analysis in accordance with the figures, or an equivalent analysis). In the example shown in FIG. 7A, the average sidewall C:Si ratio for the pulsed plasma film is about 0.65, while the continuous wave film in FIG. 7B has an average sidewall C:Si ratio of about 0.35.

What is claimed is:

1. A method comprising:
   (a) introducing a first reactant in vapor phase into a reaction chamber having a substrate therein, and allowing the first reactant to adsorb onto a surface of the substrate;
   (b) purging the reaction chamber after a flow of the first reactant has ceased;
   (c) introducing a second reactant in vapor phase into the reaction chamber while the first reactant is adsorbed onto the substrate surface;
   (d) exposing the substrate surface to plasma to drive a surface reaction between the first and second reactants on the substrate surface to form a film layer that lines the gap, wherein the plasma is a pulsed plasma;
   (e) extinguishing the plasma; and
   (f) purging the reaction chamber,
   wherein a ratio between a wet etch rate of the film layer at a middle portion of a sidewall of the gap ($WE_m$) and a wet etch rate of the film layer at a top ($WE_t$) and/or bottom ($WE_b$) of the gap is between about 0.25-3.

2. The method of claim 1, wherein a frequency of the plasma pulses during the exposing the substrate surface to plasma operation is between about 25-5000 Hz.

3. The method of claim 2, wherein the frequency of the plasma pulses is between about 100-500 Hz.

4. The method of claim 1, wherein the film deposited is a silicon nitride or silicon carbonitride film.

5. The method of claim 1, wherein the film deposited is an oxide.

6. The method of claim 1, wherein operations (c) and (d) occur, at least partially, at the same time.

7. The method of claim 1, wherein the plasma is a capacitively coupled plasma or an inductively coupled plasma.

8. The method of claim 1, wherein the plasma is generated using an RF plasma generator.

9. The method of claim 8, wherein a plasma power is between about 50-2500 W/station.

10. The method of claim 1, wherein the film formed in the gap at a middle portion of the gap, as measured vertically, exhibits a wet etch rate between about 1-25 Å/min.

11. The method of claim 4, wherein an average ratio of carbon:silicon at a sidewall of the gap is at least about 0.4.

12. The method of claim 1, wherein a composition of the film is substantially uniform throughout the film.

13. The method of claim 1, further comprising repeating operations (a) through (f), wherein a first iteration of operation (d) is performed at a different pulse frequency than a second iteration of operation (d).

14. The method of claim 1, further comprising repeating operations (a) through (f), wherein a first iteration of operation (d) is performed at a different duty cycle than a second iteration of operation (d).

15. The method of claim 1, further comprising repeating operations (a) through (f), wherein a first iteration of operation (d) is performed at a different RF power than a second iteration of operation (d).

16. The method of claim 1, wherein the pulsed plasma pulses between an on state and an off state.

17. The method of claim 1, wherein the pulsed plasma pulses between at least a first non-zero power state and a second non-zero power state, and wherein power delivered during the first non-zero power state is different from power delivered during the second non-zero power state.

18. An apparatus for depositing films on a substrate, the apparatus comprising:
    a reaction chamber;
    an inlet port for delivering gas phase reactants to the reaction chamber;
    a plasma generator for providing pulsed plasma to the reaction chamber; and
    a controller comprising instructions for
    (a) introducing a first reactant in vapor phase into the reaction chamber and allowing the first reactant to adsorb onto the substrate surface;
    (b) purging the reaction chamber after a flow of the first reactant has ceased;
    (c) introducing a second reactant in vapor phase into the reaction chamber while the first reactant is adsorbed onto the substrate surface;
    (d) periodically striking a pulsed plasma to expose the substrate surface to pulsed plasma when the vapor phase flow of the first reactant has ceased in order to drive a surface reaction between the first and second reactants on the substrate surface to form film layer that lines a gap on the substrate, the film layer having a wet etch rate at a middle portion of a sidewall of the gap ($WE_m$) and a wet etch rate at a top ($WE_t$) and/or bottom ($WE_b$) of the gap, and wherein a ratio between the wet etch rate at the middle portion of the gap ($WE_m$) and the wet etch rate at the top ($WE_t$) and/or bottom ($WE_b$) of the gap is between about 0.25-3.

19. The method of claim 1, wherein the wet etch rates correspond to etch rates that would be achieved in a solution comprising water and HF, wherein the ratio of water:HF in the solution is about 100:1.

* * * * *